(12) United States Patent
Quijano et al.

(10) Patent No.: US 11,395,437 B2
(45) Date of Patent: Jul. 19, 2022

(54) FACEPLATES WITH FILTERS

(71) Applicant: Hewlett-Packard Development Company, L.P., Spring, TX (US)

(72) Inventors: David Quijano, Fort Collins, CO (US);
Tom J. Searby, Fort Collins, CO (US);
Adolfo A. Gomez, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/756,142

(22) PCT Filed: Nov. 20, 2017

(86) PCT No.: PCT/US2017/062586
§ 371 (c)(1),
(2) Date: Apr. 15, 2020

(87) PCT Pub. No.: WO2019/099050
PCT Pub. Date: May 23, 2019

(65) Prior Publication Data
US 2020/0333856 A1    Oct. 22, 2020

(51) Int. Cl.
*H05K 7/20* (2006.01)
*G06F 1/18* (2006.01)
*G11B 33/14* (2006.01)

(52) U.S. Cl.
CPC ......... *H05K 7/20181* (2013.01); *G06F 1/181* (2013.01); *G06F 1/182* (2013.01); *G11B 33/146* (2013.01)

(58) Field of Classification Search
CPC ... G11B 33/146; H05K 7/20181; G06F 1/181; G06F 1/182
See application file for complete search history.

(56) References Cited

U.S. PATENT DOCUMENTS 4,982,627 A * 1/1991 Johnson ............... B23B 31/005
81/177.1
5,514,036 A * 5/1996 Lin ..................... G11B 33/1446
55/471
5,676,718 A * 10/1997 Davison ............... G11B 33/123
210/488

(Continued)

FOREIGN PATENT DOCUMENTS

EP    1933224    6/2008
WO    WO-2008085438    7/2008

(Continued)

OTHER PUBLICATIONS

Mann, P., Review: Corsair Graphite Series 760t, Mar. 27, 2014, http://hexus.net/tech/reviews/chassis/67917-corsair-graphite-series-760t/.

*Primary Examiner* — Nidhi Thaker
(74) *Attorney, Agent, or Firm* — Brooks Cameron & Huebsch PLLC (57) ABSTRACT

Examples herein relate to faceplates with filters. In some examples, an apparatus can include a faceplate, where the faceplate includes a plurality of perforations through a thickness of the faceplate, a filter attached to the faceplate, and a magnet to generate a magnetic attraction force between the faceplate and the filter such that the filter is magnetically attached to the faceplate.

12 Claims, 4 Drawing Sheets

(56) References Cited

U.S. PATENT DOCUMENTS

| | | | | |
|---|---|---|---|---|
| 5,935,282 | A * | 8/1999 | Lin | B01D 46/10 55/501 |
| 6,297,950 | B1 * | 10/2001 | Erwin | B01D 46/10 361/688 |
| 6,319,116 | B1 * | 11/2001 | Behl | H05K 7/20581 |
| 7,499,275 | B2 * | 3/2009 | Lai | H05K 7/20181 361/695 |
| 9,618,222 | B1 | 4/2017 | Hussain et al. | |
| 10,599,016 | B2 * | 3/2020 | Overall | G03B 17/14 |
| 2002/0163789 | A1 * | 11/2002 | Yu-Che | G06F 1/181 361/812 |
| 2005/0088817 | A1 * | 4/2005 | Ou Yang | G06F 1/20 361/695 |
| 2006/0096261 | A1 * | 5/2006 | Zhang | B01D 46/009 55/506 |
| 2007/0245701 | A1 * | 10/2007 | Su | B01D 46/42 55/490 |
| 2007/0247800 | A1 | 10/2007 | Smith et al. | |
| 2008/0115473 | A1 * | 5/2008 | Miller | B01D 46/10 55/385.6 |
| 2008/0151492 | A1 * | 6/2008 | Maddox | G06F 1/20 361/679.49 |
| 2014/0290193 | A1 * | 10/2014 | Wang | B01D 46/0087 312/236 |
| 2017/0189844 | A1 * | 7/2017 | McLeod | B01D 46/0086 |

FOREIGN PATENT DOCUMENTS

| | | |
|---|---|---|
| WO | WO-2009033194 | 3/2009 |
| WO | WO-2016083804 | 6/2016 |

* cited by examiner

FACEPLATES WITH FILTERS

BACKGROUND

Computing devices can include an enclosure. A computing device enclosure can encase components of the computing device, such as electrical and/or other computing device components. The computing device enclosure can protect electrical and/or other computing device components from debris.

DETAILED DESCRIPTION

Computing device components, such as electrical components, may generate heat. As used herein, the term "computing device" can, for example, be a laptop computer, a desktop computer, a server computer, or a mobile device, among other types of computing devices. In some examples, computing devices can utilize air to cool computing device components. For example, a computing device can utilize a fan to pull air through a computing device enclosure. The air can cool computing device components to prevent computing device components from overheating.

The air used to cool components of a computing device can be air in a space in which the computing device is located. For example, a computing device located in an office can utilize the air in the office to cool the components of the computing device.

In some examples, the air used to cool components of a computing device can include other particulate matter, such as dust, for example, Particulate matter included in the air can be deposited on components of the computing device as the air is used to cool the computing device components. The particulate matter can, in some instances, cause computing device components to be cooled less efficiently. The computing device components may suffer a decrease in performance of the computing device components, a decrease in computing device component reliability, and/or a decrease in computing device component functional life as a result of less efficient cooling due to buildup of particulate matter.

Filters attached to a computing device via a fastener, mechanical fit, and/or other similar attachment mechanisms may be difficult to remove from the computing device. For instance, a filter may be removed from the computing device to allow for the filter to be cleaned of particulate matter. Damage to the filter and/or computing device can result from detachment of the filter from the computing device. In some instances, the filter may be periodically removed, which could result in an increased chance of damaging the filter due to repetitive attachment and removal. A shield, frame, bezel, and/or other component(s) attached to the computing device to cover the shield may be similarly attached to the computing device via a fastener, mechanical fit, and/or other similar attachment mechanisms, and may suffer similar problems.

Faceplates with filters according to the disclosure can allow for a faceplate with a filter to block various particulate matter from entering a computing device enclosure. The filter can help prevent buildup of particulate matter on computing device components, which may allow for better cooling and performance of computing device components.

Figure 1:
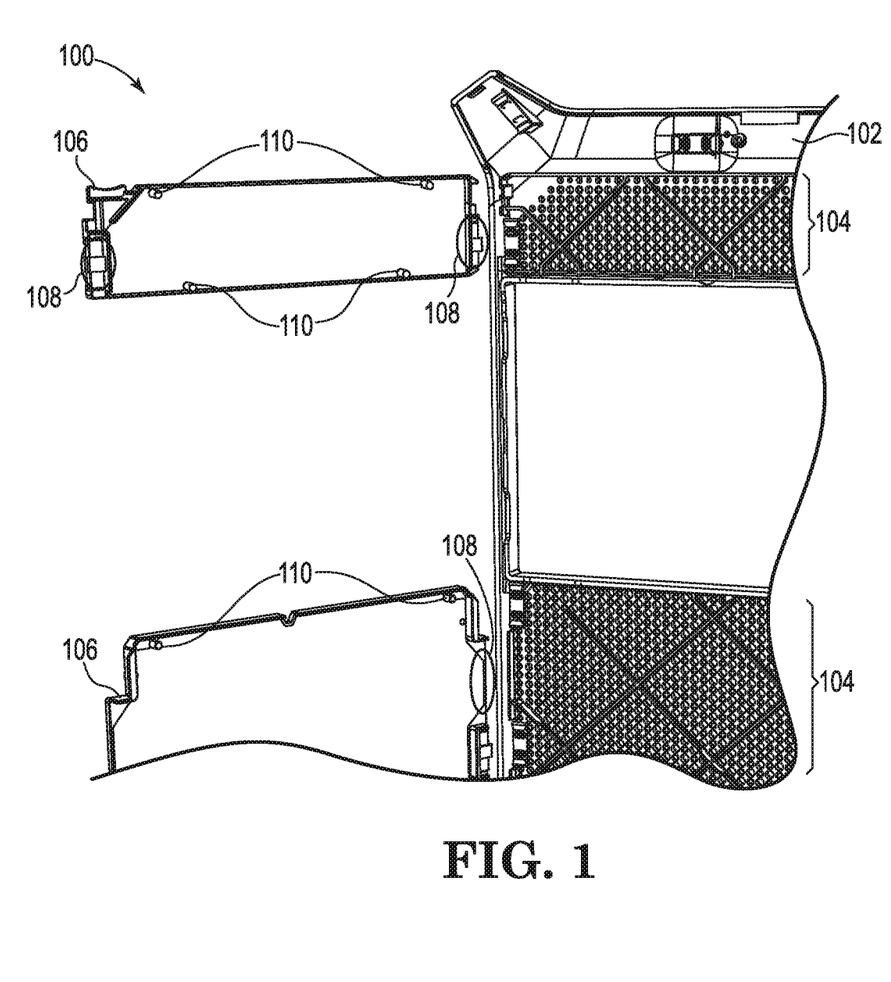
FIG. 1 illustrates a perspective view of an example of a faceplate with filter detached consistent with the disclosure.

FIG. 1 illustrates a perspective view 100 of an example of an apparatus including a faceplate 102 with filter 106 detached consistent with the disclosure. Faceplate 102 can include perforations 104. Filter 106 can include magnet 108 and guide pins 110.

As illustrated in FIG. 1, the apparatus can include a faceplate 102, As used herein, the term "faceplate" can, for example, refer to a plate, cover, or bezel on a device, such as a computing device. Faceplate 102 can be a metal, plastic, composite, or other material.

Faceplate 102 can include perforations 104. As used herein, the term "perforation" can, for example, refer to a hole through a material. For example, perforations 104 can include a series of holes through faceplate 102.

Perforations 104 can be through a thickness of faceplate 102. For example, perforations 104 include holes that extend through the thickness of the material of faceplate 102. Perforations 104 can allow air to pass through faceplate 102. For example, air can pass from a front side of faceplate 102 to a back side of faceplate 102 via perforations 104.

As illustrated in FIG. 1, the apparatus can include filter 106. As used herein, the term "filter" can, for example, refer to a porous device for removing particles from a gas passing through the porous device. For example, filter 106 can filter particles, such as particulate matter, from air as air passes through filter 106.

Filter 106 can be a nylon filter. The nylon filter can include a mesh opening of 340 microns, although examples of the disclosure are not so limited. For example, the mesh opening of the nylon filter can be greater than a 340 microns or less than 340 microns. Further, although filter 106 is described as a nylon filter, examples of the disclosure are not so limited. For example, filter 106 can be a polyethylene filter, among other filter types.

Although the apparatus is illustrated in FIG. 1 as including two filters 106, examples of the disclosure are not so limited. For example, the apparatus can include one filter or more than two filters.

Although not illustrated in FIG. 1 for clarity and so as not to obscure examples of the disclosure, filter 106 can be attached to faceplate 102. For example, filter 106 can be mechanically attached to faceplate 102 and magnetically attached to faceplate 102, as is further described herein.

Filter 106 can include guide pins 110. As used herein, the term "guide pin" can, for example, refer to a piece of material to align filter 106 with faceplate 102. For example, guide pins 110 can align filter 106 with faceplate 102 such that filter 106 covers an air intake of a computing device to prevent particulate matter from entering the computing device, as is further described in connection with FIG. 4.

Guide pins 110 can align filter 106 with particular perforations of the perforations 104 of faceplate 102. For instance, the particular perforations can be a subset of perforations of the total perforations 104. For example, the particular perforations of perforations 104 can cause filter 106 to be aligned with faceplate 102 such that filter 106 covers an air intake of a computing device.

The particular perforations can be sized to receive guide pins 110. For example, a diameter of the particular perforations can be of a size such that a diameter of guide pins 110 can fit inside the diameter of the particular perforations. In other words, the diameter of the particular perforations can be larger than the diameter of guide pins 110.

Guide pins 110 can be color coded. In some examples, guide pins 110 can be color coded to indicate that filter 106 is installed. For example, guide pins 110 can be color coded in order to indicate that for a particular computing device among a plurality of computing devices, the particular computing device has filter 106 installed, whereas other computing devices of the plurality of computing devices that do not have the color coded guide pins 110 may not have a filter 106 installed.

In some examples, guide pins 110 can be a particular color in order to indicate a particular filter type corresponding to the particular color of guide pins 110. For example, guide pins 110 can be blue in order to indicate a particular type of filter 106, as is further described in connection with FIG. 2.

In some examples, the diameter of the particular perforations can be different from the diameter of the remaining perforations 104. For example, the diameter of the particular perforations can be larger than the diameter of the remaining perforations 104 such that the guide pins 110 fit in the particular perforations, but not in the remaining perforations 104. The particular perforations of perforations 104 can receive guide pins 110 to mechanically attach filter 106 with faceplate 102, as is further described in connection with FIG. 2.

The apparatus can include a magnet 108. As used herein, the term "magnet" can, for example, refer to an object or a material that produces a magnetic field. For example, magnet 108 can be a neodymium magnet, where magnet 108 is a material that is a neodymium, iron, and boron alloy. However, examples of the disclosure are not so limited. For example, magnet 108 can be iron, nickel, a nickel-iron alloy such as Mu-metal, and/or any other magnetic materials, composites, rare-earth magnets, other magnetic alloys, and/or other combinations of materials. Magnet 108 can be attached to filter 106.

Magnet 108 can generate a magnetic attraction force between faceplate 102 and filter 106. As used herein, the term "magnetic attraction force" can, for example, refer to an attraction force arising between electrically charged particles. For example, faceplate 102 can include a material located on faceplate 102 that is magnetically attracted to magnet 108. As a result of the material on faceplate 102 that is attracted to magnets and magnet 108 being a magnet, filter 106 can be magnetically attracted to magnet 108. The magnetic attraction force between faceplate 102 and magnet 108 can cause filter 106 to be magnetically attached to faceplate 102.

Although filter 106 is described above as being magnetically attached to faceplate 102, examples of the disclosure are not so limited. For example, filter 106 can be mechanically attached to faceplate 102 via guide pins 110, as previously described above. Filter 106 can be mechanically attached to faceplate 102 via guide pins 110 by an interference fit. However, examples of the disclosure are not limited to mechanically attaching filter 106 to faceplate 102 via an interference fit. For example, filter 106 can be mechanically attached to faceplate 102 via a flexible member snap-fit, screws, and/or removable adhesive, among other fastening methods to attach two physical components.

Although each filter 106 is illustrated in FIG. 1 as including two magnets 108 per filter 106, examples of the disclosure are not so limited. For example, each filter 106 can include less than two magnets 108 or more than two magnets 108.

Filter 106 is removable from faceplate 102. Filter 106 can be removed from faceplate 102 by detaching filter 106 from the mechanical attachment and/or the magnetic attachment with faceplate 102. For example, guide pins 110 can be removed from the particular perforations of perforations 104 and/or filter 106 can be removed from magnet 108. Filter 106 can be removed from faceplate 102 to be cleaned or replaced. For example, filter 106 may experience a buildup of particulate matter on filter 106 as filter 106 prevents particulate matter from entering a computing device. As a result, of particulate matter buildup, filter 106 can be removed from faceplate 102 for replacement or for cleaning (e.g., to remove the buildup of particulate matter on filter 106).

Figure 2:
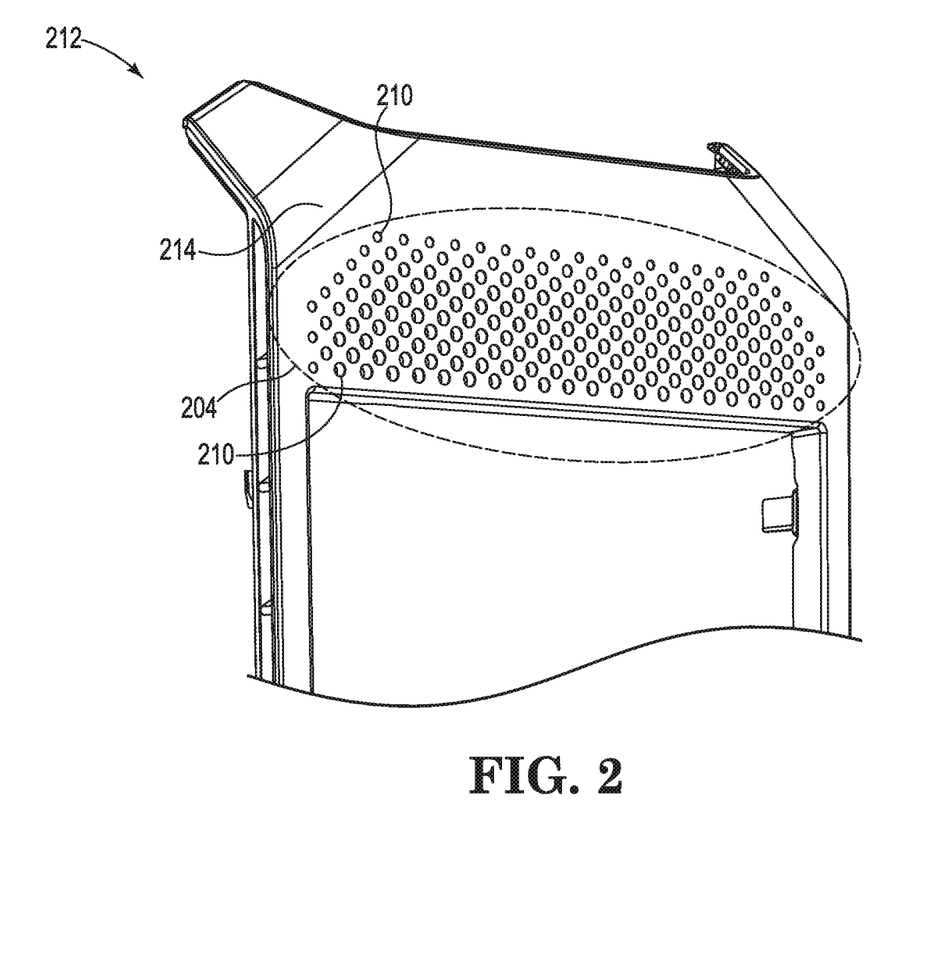
FIG. 2 illustrates a perspective view of an example of a faceplate with filter attached consistent with the disclosure.

FIG. 2 illustrates a perspective view 212 of an example of a faceplate with filter attached consistent with the disclosure. As illustrated in FIG. 2, faceplate (e.g., faceplate 102, previously described in connection with FIG. 1) can include perforations 204 (e.g., perforations 104, previously described in connection with FIG. 1) and a front surface 214.

As illustrated in FIG. 2, the filter is attached to the faceplate. However, as previously described in connection with FIG. 1, the filter can be removable from the faceplate. For example, the filter can be attached or detached from the faceplate.

Perforations 204 can include a subset of perforations to receive guide pins 210 of the filter to align the filter to the faceplate. The subset of perforations can be sized to receive guide pins 210 of the filter.

Guide pins 210 of the filter can protrude through the subset of perforations of perforations 204 of the faceplate. For example, guide pins 210 can fit inside of the subset of perforations to align the filter to the faceplate. The guide pins 210 can protrude through the subset of perforations by various distances, as is further described herein.

As illustrated in FIG. 2, guide pins 210 can protrude through the subset of perforations of perforations 204 of the faceplate by a distance less than the thickness of the faceplate. For example, the faceplate can include a thickness of five millimeters. Guide pins 210 can protrude through the subset of perforations by a distance of four millimeters. In other words, guide pins 210 can protrude through the subset of perforations by a distance less than the thickness of the faceplate such that guide pins 210 are recessed from front surface 214 of the faceplate.

Guide pins 210 can be color coded. The color coding of guide pins 210 can indicate whether the computing device has a filter installed, a type of filter installed on the computing device, and/or the porosity of the filter installed on the computing device, among other examples.

For example, guide pins 210 can be colored blue. However, examples of the disclosure are not so limited. For example, guide pins 210 can include a combination of colors, such as a yellow color around a perimeter of end surfaces of guide pins 210 and a blue color for the interior of the end surfaces of guide pins 210, or any other color, pattern, and/or combination of colors.

In some examples, as described above, guide pins 210 can be color coded such that a color of guide pins 210 can correspond to a filter type of the filter. For example, as previously described in connection with FIG. 1, the filter can be a nylon filter. Guide pins 210 can be a blue color to indicate the filter is a nylon filter. In some examples, the filter can be a polyethylene filter. Guide pins 210 can be a yellow color, or any other color, color combination, or color pattern to indicate the filter is a polyethylene filter.

Although not illustrated in FIG. 2 for clarity and so as not to obscure examples of the disclosure, guide pins 210 can protrude through the subset of perforations of perforations 204 of the faceplate by a distance equal to the thickness of the faceplate. For example, the faceplate can include a thickness of five millimeters. Guide pins 210 can protrude through the subset of perforations by a distance of five millimeters. In other words, guide pins 210 can protrude through the subset of perforations by a distance equal to the thickness of the faceplate such that the end surfaces of guide pins 210 are adjacent to front surface 214 of the faceplate.

Figure 3:
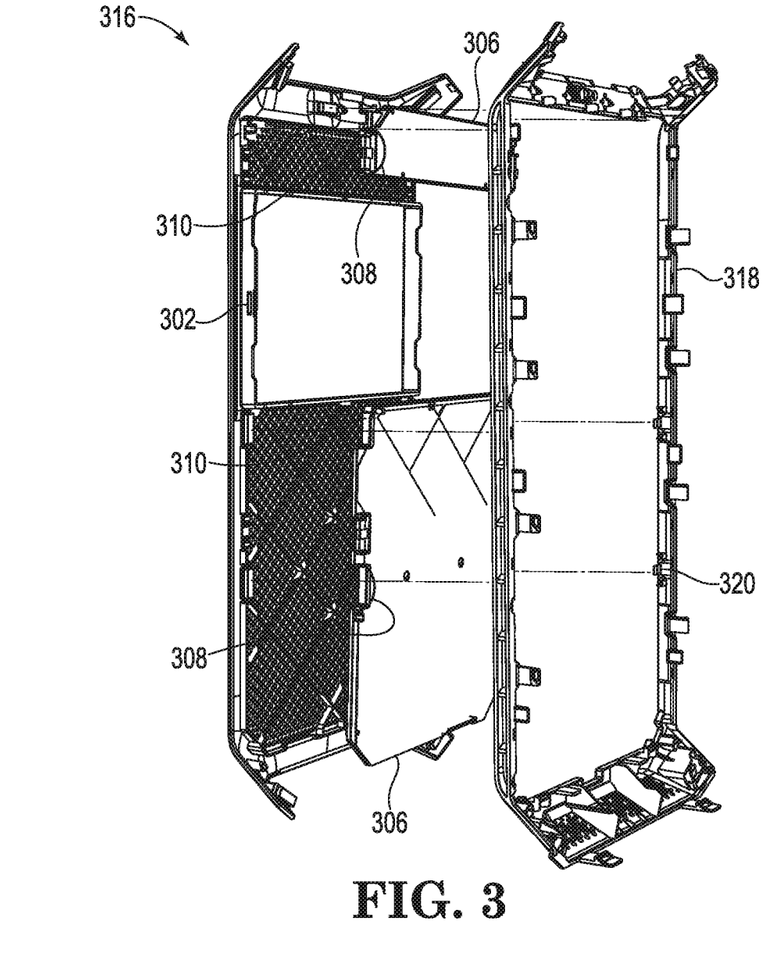
FIG. 3 illustrates a perspective view of an example of a system consistent with the disclosure.

FIG. 3 illustrates a perspective view 316 of an example of a system consistent with the disclosure. As illustrated in FIG. 3, the system can include a faceplate 302 (e.g., faceplate 102, previously described in connection with FIG. 1), filter 306 (e.g., filter 106, previously described in connection with FIG. 1), and frame 318.

Faceplate 302 can include perforations through faceplate 302. The perforations can be a series of holes through faceplate 302. For example, faceplate 302 can include a series of perforations through a thickness of faceplate 302 such that air can pass from a front side of faceplate 302 to a back side of faceplate 302 via the series of perforations.

The system can include filter 306. Filter 306 can include guide pins 310. In some examples, filter 306 can be mechanically attached to faceplate 302 via guide pins 310. For example, guide pins 310 can fit inside of a subset of perforations of the total perforations included on faceplate 302. The particular perforations included in the subset of perforations can be sized to receive guide pins 310. The particular perforations included in the subset of perforations can align filter 306 with faceplate 302 such that filter 306 is mechanically attached to faceplate 302 in a location to cover an air intake of a computing device, as is further described in connection with FIG. 4.

Filter 306 can include magnet 308. Magnet 308 can be attached to filter 306. Magnet 308 can generate a magnetic attraction force to magnetically attract filter 306 to faceplate 302 such that filter 306 can be magnetically attached to faceplate 302, as is further described herein.

Although not shown in FIG. 3 for clarity and so as not to obscure examples of the disclosure, each filter 306 can include two magnets. However, examples of the disclosure are not so limited. For example, each filter 306 can include more than two magnets 308 or less than two magnets 308. Filter 306 can include an amount of magnets 308 in order to attach filter 306 to faceplate 302 via a magnetic attraction force generated by magnets 308.

Filter 306 can be magnetically attached to faceplate 302 via magnets 308 located on filter 306. For example, faceplate 302 can include a material located on faceplate 302 that is magnetically attracted to magnet 308 to cause faceplate 302 to be magnetically attracted to magnet 308. Magnet 308 can generate a magnetic attraction force between faceplate 302 and magnet 308 to cause filter 306 to be magnetically attached to faceplate 302. For example, faceplate 302 can include steel material located on faceplate 302 to cause a magnetic attraction force between faceplate 302 and magnet 308 to cause filter 308 to be magnetically attached to faceplate 302.

Although filter 306 is described as including magnets 308, examples of the disclosure are not so limited. In some examples, faceplate 302 can include magnets and filter 306 can include a material located on filter 306 that is magnetically attracted to the magnets on faceplate 302 to cause filter 306 to be magnetically attracted to magnet 308. In some examples, faceplate 302 can include magnets and filter 306 can include magnets to cause magnets on filter 306 to be magnetically attracted to magnets on faceplate 302.

The system can include frame 318. As used herein, the term "frame" can, for example, refer to a structure used as a support to other parts or structures. Frame 318 can include magnet 320. Magnet 320 can be a neodymium magnet, where magnet 320 is a material that is a neodymium, iron, and boron alloy. However, examples of the disclosure are not so limited. For example, magnet 320 can be iron, nickel, a nickel-iron alloy such as Mu-metal, and/or any other magnetic materials, composites, rare-earth magnets, other magnetic alloys, and/or other combinations of materials. Magnet 320 can be attached to frame 318.

Magnet 320 can generate a magnetic attraction force between faceplate 302 and frame 318. For example, faceplate 302 can include a material located on faceplate 302 that is magnetically attracted to magnet 320. As a result of the material on faceplate 302 that is attracted to magnets and magnet 320 being a magnet, faceplate 302 can be magnetically attracted to magnet 320. The magnetic attraction force between faceplate 302 and magnet 320 can cause faceplate 302 to be magnetically attached to frame 318. In other words, faceplate 302 can be magnetically attached to frame 318 via magnet 320 of frame 318. Frame 318 can support faceplate 302, and frame 318 can be attached to a computing device, as is further described in connection with FIG. 4.

Although frame 318 is described as including magnet 320, examples of the disclosure are not so limited. In some examples, faceplate 302 can include magnets and frame 318 can include a material located on frame 318 that is magnetically attracted to the magnets on faceplate 302 to cause frame 318 to be magnetically attracted to the magnets on faceplate 302. In some examples, faceplate 302 can include magnets and frame 318 can include magnets to cause magnets on faceplate 302 to be magnetically attracted to magnets on frame 318.

Figure 4:
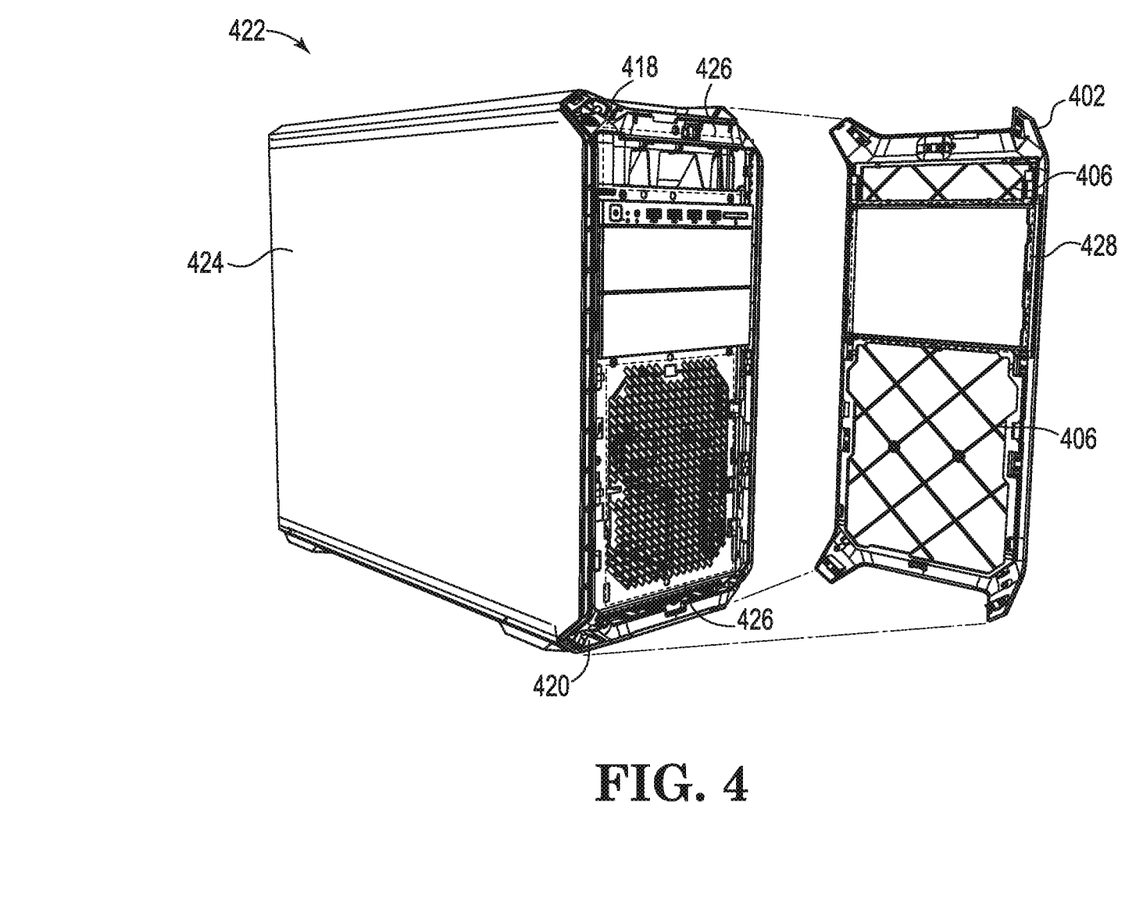
FIG. 4 illustrates a perspective view of an example of a computing device consistent with the disclosure.

FIG. 4 illustrates a perspective view 422 of an example of a computing device consistent with the disclosure. The computing device can include a chassis 424, air intake 426, frame 418 (e.g., frame 318, previously described in connection with FIG. 3), filter 406 (e.g., filter 106, 306, previously described in connection with FIGS. 1 and 3, respectively), and faceplate 402 (e.g., faceplate 102, 302, previously described in connection with FIGS. 1 and 3, respectively). Faceplate 402 can include opening 428. Frame 418 can include magnet 420 (e.g., magnet 320, previously described in connection with FIG. 3).

The computing device can include chassis 424. As used herein, the term "chassis" can, for example, refer to a frame for mounting components. Chassis 424 of the computing device can, for example, be a frame for mounting various components of the computing device. For example, chassis 424 can be utilized to mount computing device components that may generate heat, as well as other computing device components used to cover or protect electronic computing device components.

The computing device can include faceplate 402. Faceplate 402 can include perforations (e.g., perforations 104, 204, previously described in connection with FIGS. 1 and 2). The perforations can be through a thickness of faceplate 402.

Filter 406 can include a magnet (e.g., magnet 108, previously described in connection with FIG. 1). Filter 406 can be attached to and removable from faceplate 402. For example, filter 406 can be removable from faceplate 402 for replacement or cleaning.

Filter 406 can be mechanically and/or magnetically attached to faceplate 402. Filter 406 can be mechanically attached to faceplate 402 via guide pins (e.g., guide pins 110, 210, 310, previously described in connection with FIGS. 1-3, respectively) included on filter 406. For example, guide pins of filter 406 can be received by particular perforations of the total amount of perforations of faceplate 402 to mechanically attach filter 406 to faceplate 402.

Filter 406 can be magnetically attached to faceplate 402 via a magnet attached to filter 406. For example, filter 406 can include a magnet, and faceplate 402 can include a portion of faceplate 402 that is of a material magnetically attracted to the magnet of filter 406. As a result of a magnetic attraction force between the magnetic material of faceplate 402 and the magnet of filter 406, filter 406 can be magnetically attached to faceplate 402.

Filter 406 can be attached to faceplate 402 at a location on faceplate 402 that corresponds to air intake 426 of the computing device. For example, as illustrated in FIG. 4, filter 406 can be attached to a top portion of faceplate 402 and a bottom portion of faceplate 402. The top portion and bottom portions of faceplate 402 can correspond to locations of air intake 426 of the computing device. As a result, filter 406 can correspondingly be located at locations of air intake 426 such that filter 406 can prevent particulate matter from entering the computing device via air intake 426.

For example, the computing device may include a fan. Although not illustrated in FIG. 4, the fan can be attached to chassis 424 of the computing device (e.g., the fan can be internal to the computing device). The fan can pull air from outside of the computing device into the computing device via air intake 426 in order to cool components of the computing device that may generate heat. Filter 406 can prevent particulate matter included in the air pulled by the fan from entering the computing device via air intake 426. The particulate matter can be deposited onto filter 406 rather than on components of the computing device.

Faceplate 402 can include opening 428. Opening 428 can allow for mounting locations of peripheral devices of the computing device to be exposed. For example, mounting locations for industry standard or custom input/output devices and/or storage devices, among other peripheral devices, may be exposed via opening 428 of faceplate 402.

The computing device can include frame 418 (e.g., frame 318, previously described in connection with FIG. 3). Frame 418 can be attached to chassis 424 of the computing device. For example, frame 418 can be mechanically attached to chassis 424. Frame 418 can be mechanically attached to chassis 424 via a flexible member snap-fit, screws, adhesive, and/or other fastening methods to attach two physical components. The mechanical attachment of frame 418 to chassis 424 can provide a semi-permanent rigid attachment of frame 418 to chassis 424 such that it can be more difficult to remove frame 418 from chassis 424 than removing faceplate 402 from frame 418 and/or removing the filter from faceplate 402.

Faceplate 402 can be magnetically attached to frame 418. For example, frame 418 can include a magnet 420 (e.g., magnet 320, previously described in connection with FIG. 3). Faceplate 402 can be magnetically attached to frame 418 via magnet 420.

Faceplate 402 can be removable from frame 418. For example, during operation of the computing device, the fan of the computing device may pull air through air intake 426 to cool components of the computing device. Filter 406 can capture particulate matter from the air, and the particulate matter can be deposited onto filter 406. Particulate matter may be deposited onto filter 406 over time. When too much particulate matter is deposited onto filter 406, filter 406 may have to be cleaned or replaced.

In order to clean or replace filter 406, faceplate 402 can be removed from frame 418. For example, a user may detach faceplate 402 from frame 418 by overcoming the magnetic force from the magnet 420 of frame 418. A user can then remove filter 406 from faceplate 402. For example, a user may detach filter 406 from faceplate 402 by overcoming the magnetic force from the magnet (e.g., magnet 108, 308) of the filter 406 and/or removing the guide pins (e.g., guide pins 110, 210, 310) from the particular perforations of the total amount of perforations of faceplate 402.

Attaching filter 406 magnetically to faceplate 402, and attaching faceplate 402 magnetically to frame 418, can allow for easy removal of faceplate 402 and filter 406. For example, a user can easily gain access to filter 406 to remove filter 406 for cleaning and/or replacement while reducing chances of mechanically attached components breaking due to removal and reattachment.

Although not illustrated in FIG. 4 for clarity and so as not to obscure examples of the disclosure, guide pins of filter 406 can be color coded. The color coded guide pins can allow a user to easily determine whether the computing device includes a filter. Identification of the filter can allow a user to determine computing devices that may have filters having to be cleaned and/or replaced.

As used herein, "a" can refer to one such thing or more than one such thing.

The above specification, examples and data provide a description of the method and applications, and use of the system and method of the disclosure. Since many examples can be made without departing from the scope of the system and method of the disclosure, this specification merely sets forth some of the many possible examples and implementations.

What is claimed is:
1. An apparatus, comprising:
a faceplate, wherein:
the faceplate includes a plurality of perforations through a thickness of the faceplate, the plurality of perforations including a first set of perforations and a second set of perforations; and
the first set of perforations include a diameter that is larger than a diameter of the second set of perforations;
a filter attached to the faceplate, the filter including guide pins that are colored and have a particular diameter to align the filter with the first set of perforations, wherein the guide pins are color coded to indicate a particular filter type of the filter attached to the faceplate; and
a magnet to generate a magnetic attraction force between the faceplate and the filter such that the filter is magnetically attached to the faceplate.

2. The apparatus of claim 1, wherein the filter is removable from the faceplate.

3. The apparatus of claim 1, wherein guide pins of the filter protrude through the first set of perforations of the plurality of perforations of the faceplate.

4. The apparatus of claim 3, wherein the guide pins protrude through the first set of perforations of the plurality of perforations of the faceplate by a distance equal to the thickness of the faceplate such that an end surface of the guide pins are adjacent to a front surface of the faceplate.

5. The apparatus of claim 3, wherein the guide pins protrude through the first set of perforations of the plurality of perforations of the faceplate by a distance less than the thickness of the faceplate such an end surface of the guide pins are recessed from a front surface of the faceplate.

6. A system, comprising:
   a faceplate including a plurality of perforations through the faceplate, wherein the plurality of perforations include a first set of perforations and a second set of perforations, the first set of perforations having a diameter that is larger than a diameter of the second set of perforations;
   a filter including a magnet and guide pins that are colored, wherein:
      the guide pins include a diameter to align the filter with the first set of perforations;
      the guide pins are color coded to indicate a particular filter type of the filter; and
      the filter is magnetically attached to the faceplate via the magnet; and
   a frame, wherein the faceplate is magnetically attached to the frame via a magnet of the frame.

7. The system of claim 6, wherein the first set of perforations of the plurality of perforations receive the guide pins of the filter to mechanically attach the filter to the faceplate.

8. A computing device, comprising:
   a chassis;
   a faceplate including a plurality of perforations through the faceplate, wherein the plurality of perforations include a first set of perforations and a second set of perforations, the first set of perforations having a diameter that is larger than a diameter of the second set of perforations;
   a filter including guide pins that are colored and a magnet and attached to and removable from the faceplate, wherein:
      the guide pins include a diameter to align the filter with the first set of perforations such that the filter is mechanically attached to the faceplate via the guide pins of the filter;
      the guide pins are color coded to indicate a particular filter type of the filter; and
      the filter is magnetically attached to the faceplate via the magnet; and
   a frame attached to the chassis of the computing device, wherein the faceplate is magnetically attached to the frame via a magnet of the frame and is removable from the frame.

9. The computing device of claim 8, wherein the filter is attached to the faceplate at a particular location on the faceplate that corresponds to a location of an air intake of the computing device such that the filter prevents particulate matter from entering the computing device via the air intake.

10. The computing device of claim 8, wherein the faceplate includes a material that is magnetically attractive such that:
   the magnet of the filter is magnetically attracted to the material of the faceplate; and
   the magnet of the frame is magnetically attracted to the material of the faceplate.

11. The computing device of claim 8, wherein the guide pins are color coded to indicate the computing device includes the filter.

12. The computing device of claim 8, wherein the frame is mechanically attached to the chassis of the computing device.

* * * * *